United States Patent
Gruhlke et al.

(10) Patent No.: US 10,113,109 B2
(45) Date of Patent: *Oct. 30, 2018

(54) OXO- AND HYDROXO-BASED COMPOSITE INORGANIC LIGANDS FOR QUANTUM DOTS

(71) Applicant: KONINKLIJKE PHILIPS N.V., Eindhoven (NL)

(72) Inventors: Stefan Willi Julius Gruhlke, Baesweiler (NL); Patrick John Baesjou, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/114,247

(22) PCT Filed: Jan. 26, 2015

(86) PCT No.: PCT/EP2015/051460
§ 371 (c)(1),
(2) Date: Jul. 26, 2016

(87) PCT Pub. No.: WO2015/117851
PCT Pub. Date: Aug. 13, 2015

(65) Prior Publication Data
US 2017/0029693 A1 Feb. 2, 2017

(30) Foreign Application Priority Data

Feb. 4, 2014 (EP) .................................. 14153828
Jul. 11, 2014 (EP) .................................. 14176692

(51) Int. Cl.
*H01L 33/00* (2010.01)
*C09K 11/02* (2006.01)
(Continued)

(52) U.S. Cl.
CPC ............ *C09K 11/02* (2013.01); *C09K 11/025* (2013.01); *C09K 11/565* (2013.01);
(Continued)

(58) Field of Classification Search
CPC .................. H01L 33/502; H01L 33/56; H01L 2933/0083; C09K 11/02; C09K 11/565;
(Continued)

(56) References Cited

U.S. PATENT DOCUMENTS 7,160,613 B2  1/2007  Bawendi et al.
9,034,978 B2 * 5/2015  Thalappil ............... B82Y 20/00
                                                        252/301.36
(Continued)

FOREIGN PATENT DOCUMENTS

CN       103055954 A      4/2013
WO    2009035657 A1     3/2009
(Continued)

OTHER PUBLICATIONS

EPO as ISA, International Search Report and Written Opinion dated Apr. 30, 2015 from International Application No. PCT/EP2015/051460, filed Jan. 26, 2015, 12 pages.
(Continued)

*Primary Examiner* — Kevin M Picardat

(57) ABSTRACT

The invention provides a luminescent material (10) comprising quantum dots (100), wherein the luminescent material (10) further comprises a capping agent (110) coordinating to the quantum dots (10), wherein the capping agent comprises $M_xO_y(OH)_z^n$, wherein M is selected from the group consisting of B, Al, P, S, V, Zn, Ga, Ge, As, Se, Nb, Mo, Cd, In, Sn, Sb, Te, Ta and W, wherein $x \geq 1$, $y+z \geq 1$, and wherein n indicates a positive or negative charge of the capping agent.

10 Claims, 4 Drawing Sheets

(51) Int. Cl.
  *C09K 11/56* (2006.01)
  *C09K 11/88* (2006.01)
  *H01L 33/56* (2010.01)
  *H01L 33/50* (2010.01)
  *B82Y 20/00* (2011.01)
  *B82Y 40/00* (2011.01)

(52) U.S. Cl.
  CPC .......... *C09K 11/883* (2013.01); *H01L 33/502* (2013.01); *H01L 33/56* (2013.01); *B82Y 20/00* (2013.01); *B82Y 40/00* (2013.01); *H01L 33/50* (2013.01); *H01L 2251/5369* (2013.01); *H01L 2933/0083* (2013.01); *Y10S 977/774* (2013.01); *Y10S 977/825* (2013.01); *Y10S 977/892* (2013.01); *Y10S 977/95* (2013.01)

(58) Field of Classification Search
  CPC ..... C09K 11/883; C09K 11/025; B82Y 20/00; B82Y 40/00; Y10S 977/774; Y10S 977/825; Y10S 977/892; Y10S 977/95
  USPC .......................................................... 257/98
  See application file for complete search history.

(56) References Cited

U.S. PATENT DOCUMENTS

| | | | | |
|---|---|---|---|---|
| 9,412,916 | B2* | 8/2016 | Xu | C09K 11/02 |
| 2011/0260109 | A1* | 10/2011 | Shih | B82Y 5/00 |
| | | | | 252/301.16 |
| 2012/0032122 | A1* | 2/2012 | Zong | C30B 7/00 |
| | | | | 252/519.4 |
| 2012/0104325 | A1* | 5/2012 | Talapin | B82Y 30/00 |
| | | | | 252/502 |
| 2012/0261651 | A1* | 10/2012 | Noto | C09K 11/06 |
| | | | | 257/40 |
| 2014/0256532 | A1* | 9/2014 | Landry | B01J 35/004 |
| | | | | 502/1 |
| 2014/0346442 | A1* | 11/2014 | Nag | H01L 29/0665 |
| | | | | 257/29 |
| 2015/0217374 | A1* | 8/2015 | Kim | B22F 9/24 |
| | | | | 420/501 |
| 2017/0012180 | A1* | 1/2017 | Baesjou | C09K 11/02 |

FOREIGN PATENT DOCUMENTS

| | | |
|---|---|---|
| WO | 2010014198 A1 | 2/2010 |
| WO | 2011031871 A1 | 3/2011 |
| WO | 2012035109 A1 | 3/2012 |
| WO | 2012104325 A1 | 8/2012 |
| WO | 2012158847 A2 | 11/2012 |
| WO | 2013057702 A1 | 4/2013 |
| WO | 2013114308 A1 | 8/2013 |

OTHER PUBLICATIONS

Angshuman, et al., Metal-free Inorganic Ligands for Colloidal Nanocrystals: S2-, HS-, Se2-, HSe-, Te2-, HTe-, TeS32-, OH-, and NH2- as Surface Ligands, Journal of the American Chemical Society, 2011, 133 (27), pp. 10612-10620.

First Office Action dated Mar. 19, 2018, Chinese Patent Application No. 201580007256.8, 15 pages.

Otto, et al., "Colloidal Nanocrystals Embedded in Macrocrystals: Robustness, Photostability, and Color Purity", American Chemical Society Publications/Nano Letters, 2012, 12, pp. 5348-5354.

Article 94(3) EPC dated Feb. 12, 2018, European Patent Application No. 15702690.7, 7 pages.

First Office Action dated Feb. 27, 2018, China Application No. 201580007246.4, 13 pages.

EPO as ISA, International Search Report and Written Opinion dated Apr. 8, 2015, from International Application No. PCT/EP2015/051746, filed Jan. 29, 2015, 8 pages.

Extended European Search Report dated Jun. 25, 2014, European Application No. 14153828.0, 5 pages.

Extended European Search Report dated Nov. 3, 2014, European Application No. 14176692.3, 8 pages.

Yu Ke, et al. "Recent Patents on Quantum Dot Engineering for Biomedical Application", Recent Patents on Biomedical Engineering, vol. 5, No. 3, Nov. 1, 2012, pp. 223-234.

Prinsa Verma, et al. "Capped semiconductor nanocrystals for device applications", Optics Communications 284 (2011), pp. 881-884.

Kovalenko, et al. "Expanding the Chemical Versatility of Colloidal Nanocrystals Capped with Molecular Metal Chalcogenide Ligands", J. Am. Chem. Soc., 2010, 132 (29), pp. 10085-10092.

Koole, et al. "On the Incorporation Mechanism of Hydrophobic Quantum Dots in Silica Spheres by a Reverse Microemulsion Method", Chem. Mater., 2008, 20(7), pp. 20503-22512.

* cited by examiner

OXO- AND HYDROXO-BASED COMPOSITE INORGANIC LIGANDS FOR QUANTUM DOTS

CROSS-REFERENCE TO RELATED APPLICATIONS

The present application is a § 371 application of International Application No. PCT/EP2015/051460 filed on Jan. 26, 2015 and entitled "OXO- AND HYDROXO-BASED COMPOSITE INORGANIC LIGANDS FOR QUANTUM DOTS," which claims priority to European Patent Application No. 14153828.0, filed Feb. 4, 2014 and European Patent Application No. 14176692.3, filed Jul. 11, 2014. Applications PCT/EP2015/051460, EP14153828.0, and EP14176692.3 are incorporated herein.

FIELD OF THE INVENTION

The invention relates to a method for the production of a (particulate) luminescent material based on quantum dots as well as to such (particulate) luminescent material per se. Further, the invention relates to a lighting device including such (particulate) luminescent material based on quantum dots.

BACKGROUND OF THE INVENTION

The synthesis of quantum dots is known in the art. US2012104325, for instance, describes an isolable colloidal particle comprising a nanoparticle and an inorganic capping agent bound to the surface of the nanoparticle, a solution of the same, a method for making the same from a biphasic solvent mixture, and the formation of structures and solids from the isolable colloidal particle. The process can yield materials suitable for photovoltaic cells, piezoelectric crystals, thermoelectric layers, optoelectronic layers, light emitting diodes, ferroelectric layers, thin film transistors, floating gate memory devices, imaging devices, phase change layers, and sensor devices. Especially, this document describes an isolable colloidal particle comprising an inorganic capping agent bound to a surface of a nanoparticle and substantially free of an organic capping agent. Further, this document describes a solution of such colloidal particle comprising a solvent and the inorganic capping agent bound to a surface of a nanoparticle, wherein the solution is substantially free of an organic capping agent.

WO2012158847 describes an isolable colloidal particle comprising a nanoparticle and an inorganic capping agent bound to the surface of the nanoparticle, a method for making the same in a biphasic solvent mixture, and the formation of structures and solids from the isolable colloidal particle. The process described by WO2012158847 may yield photovoltaic cells, piezoelectric crystals, thermoelectric layers, optoelectronic layers, light emitting diodes, ferroelectric layers, thin film transistors, floating gate memory devices, phase change layers, and sensor devices.

SUMMARY OF THE INVENTION

Quantum dots (qdots or QDs) are currently being studied as phosphors in solid state lighting (SSL) applications (LEDs). They have several advantages such as a tunable emission and a narrow emission band which can help to significantly increase the efficacy of LED based lamps, especially at high CRI. Typically, qdots are supplied in an organic liquid, with the quantum dots surrounded by organic ligands, such as oleate (the anion of oleic acid), which helps to improve the emission efficiency of the dots as well as stabilize them in organic media. Such organic media often include polymer matrices, such as acrylates.

While being a convenient arrangement, such polymer matrices are (often) found to be instable (browning) against prolonged exposure to LED conditions, and the same holds true for the quantum dots (reduced emission). It is known in general that organic materials tend be unstable in the long term against high temperature (e.g. between 50-150° C.) or high (blue) light flux (e.g. between 1 and 100 W/cm$^2$), or a combination thereof, such as typically found in an LED lamp. In that sense, the interface between the organic ligands and the qdots is also suspected to be a source of instabilities. Finally, qdots themselves suffer from long-term instabilities under such conditions which are found to be related (at least partly) to moisture (water) and/or oxygen.

Hence, the long-term instabilities of a qdot/matrix composite as related to prevailing LED condition (high temperature and light flux), as well as the qdot sensitivity to moisture, are all hampering the use of qdot phosphors in LEDs applications. Therefore, there is a drive towards using materials that are more stable against the conditions prevailing in LED lamps, as well materials or geometries that shield the qdots from water and/or oxygen. Ideally, this could all be combined in one material that would also be compatible with the qdots.

As indicated above, it appears that the use of organic ligands for coordinating to quantum dots in general lead to luminescent materials that have relative low (emissive) stability (especially under high light flux conditions). Efforts to use other systems, such as with inorganic ligands, also led to luminescent materials with relative low quantum efficiencies. Hence, it is an aspect of the invention to provide an alternative (particulate, especially micro particulate) luminescent material and/or an alternative method for the production of such (particulate) luminescent material, which preferably further at least partly obviate one or more of above-described drawbacks. It is further an aspect of the invention to provide an alternative lighting device including such luminescent material, which has stable optical properties. It is further an aspect of the invention to provide an alternative wavelength converter element including such luminescent material and/or an alternative lighting device including such wavelength converter element.

Herein, amongst others the replacement of the organic ligands with inorganic ones is described, which may optionally in embodiments further serve as a scaffold for growing a fully inorganic matrix by a simple precipitation mechanism. The specific ligands found surprisingly provide luminescent materials (based on quantum dots) that have relative high quantum efficiencies. Further, the optional combination with an inorganic matrix may ensure that the quantum dots are in a fully inorganic environment where the matrix can also serve as a barrier against water and/or air, helping with the long term stability of the qdots (under LED conditions) without the need for further sealing at the die or component level.

Herein, it is proposed to replace the organic ligands on the quantum dots by inorganic ligands, most notably composite anions consisting of a metal ion and several anions. The ligand exchange makes the qdots dispersible in water or other polar solvents such as DSMO or formamide. It was surprisingly found that that with several of composite anions (such as $Zn(OH)_4^{2-}$), sometimes in combination with a second ion such as (excess) hydroxide, the large drop in QE of the qdots hat is commonly observed with the exchange of the original organic ligands for other organic ions or inorganic ions can be prevented to a large extent.

In a first aspect, the invention provides a luminescent material comprising quantum dots, wherein the luminescent material further comprises a capping agent coordinating to the quantum dots, wherein the capping agent comprises $M_xO_y(OH)_z^n$, wherein M is selected from the group consisting of B, Al, P, S, V, Zn, Ga, Ge, As, Se, Nb, Mo, Cd, In, Sn, Sb, Te, Ta and W, wherein x≥1, y+z≥1, and wherein n indicates a positive or negative charge of the capping agent. Characteristic values for x are e.g. selected from the range of 1-6, such as 1-4. Characteristic values for y are e.g. selected from the range of 0-10, such as 0-6. Characteristic values for z are e.g. selected from the range of 0-10, such as 0-6. Characteristic values for n are especially selected from the range of (−12)-(−1), such as (−6) (−1), like (−4) (−1). The value of n is the result of the choice of the elements and their oxidation states, e.g. for $MoO_4$, n=−2, or for $SnO_3$, n=−1 or n=−2.

The large reduction of the quantum efficiency of commercial qdots upon exchange of the original organic ligands for inorganic ions is overcome by the current invention. This exchange may also protect against long-term instabilities observed with the use of organic-ligand capped qdots as related to prevailing LED conditions (high temperature and light flux), as well as the qdot sensitivity to moisture, all hampering the use of qdot phosphors (i.e. luminescent materials) in LEDs applications. The qdots are also prepared for later incorporation into an inorganic matrix material. Herein the use of $M_xO_y(OH)_z^n$ as inorganic ligands to achieve high quantum yield in quantum dots where the original ligands are exchanged for these ligands is suggested. Hence, oxo- and hydroxo-based composite inorganic ligands for quantum dots are provided. Note that oxo- and hydroxo may be interchangeable, especially in a protic (aqueous) environment.

These above-mention capping agent appears to coordinate to the quantum dots, especially their outer shell or layer. Such outer layer may e.g. include ZnS. Hence, negatively charged capping agents may e.g. coordinate to metal cations (at the surface of the QD), such as Zn, and positively charged capping agents may e.g. coordinate to anions (at the surface of the QD), such as S, just like it is presently known for organic ligands. The invention is not limited to quantum dots having an outer layer or ZnS.

It further appears that the organic ligands, which are in general coordinating quantum dots can effectively be replaced with the inorganic ligands, see also below, and substantially no organic ligands (or organic capping agents) remain. Hence, the luminescent material substantially does not include organic capping agents anymore. Especially, when also organic capping agents (if any) are coordinating to the quantum dots, the amount of organic capping agents is less than 5 wt. %, such as less than 1 wt. % relative to the total weight of quantum dots. The presence of organic ligands may e.g. be determined from IR (infra-red) measurements. A substantial absence of C—H stretching vibrations in IR may be indicative of the absence of organic capping agents, such with an amount of 1 wt. % or less relative to the total weight of quantum dots, such as equal to or less than 0.5 wt. %. The capping agent may substantially enclose the quantum dot. Due to this fact, the quantum dots may be well solvable in aqueous (optionally alkaline) media (see also below). Further, if the ligands contain elements not present in the qdots (e.g. Sn (generally not available in QDs)), those can be detected by SEM/EDX, XPS, etc.

The inorganic capping agents can e.g. be discrete species, linear or branched chains, or two-dimensional sheets. Ionic inorganic capping agents are commonly referred to as salts, a pairing of a cation and an anion, and the portion of the salt specifically referred to as an inorganic capping agent is the ion that displaces the organic capping agent and caps the nanoparticle. Often an inorganic ion is paired with an ion that has organic functionality; the paired ion that does not displace organic capping agents is referred to herein as a counter ion. The counter ion can affect the solubility and reactivity of the inorganic capping agent as well as the inorganic capped nanomaterial but the great variability of counter ions allows for their facile replacement and a balance of desired properties. Instead of the term "ligand" also the terms "capping agent" or "capping ligand" or "coordinating ligand" are applied herein. As indicated above, the organic capping agent may be applied to stabilize the QD in an organic solvent. The term "capping agent" may also refer to a plurality of different capping agents. The inorganic capping ligands herein may also be defined as "coordinating ion" or "graft" or "grafting ligand". The herein described capping agents are especially ionic agents. Examples thereof are so-called Zintl ions (see also below). Positively charged capping agents may coordinate to anions, such as the S ion or the Se ion, in an outer layer of the quantum dots and negatively charged capping agents may coordinate to cations, such as Zn cation or Cd cation, in an outer layer of the quantum dots.

In view of chemical stability of the ligands, coordinating abilities, reactivity of the ligands with the QDs, and/or undesired optical absorption or other undesired optical behavior, especially M is selected from the group consisting of Al, V, Zn, As, Se, Mo, Sn, and W, even more especially M is selected from the group consisting of Al, V, Zn, Mo, Sn, and W. For instance, the capping agent may comprise one or more of the aluminate ion (such as $Al(OH)_4^-$), the stannate ion (such as $SnO_3^-$, $SnO_3^{2-}$, and $SnO_4^{4-}$), (the arsenate ion (such as $AsO_4^{3-}$, $AsO_3^{3-}$), the selenate ion (such as $SeO_4^{2-}$)), the vanadate ion (such as $VO_3^-$, $VO_4^{3-}$), the molybdate ion (such as $MoO_4^{2-}$), the tungstate ion (such as $WO_4^{2-}$) and the zincate ion (such as $Zn(OH)_4^{2-}$)(tetrahydroxozincate). Hence, combinations of two or more different type of capping agents may be applied. Especially the capping ligands wherein M comprises one or more of Al, V, Zn, Mo, Sn, and W may provide stable complexes at neutral pH and/or may provide substantially non-toxic complexes.

The phrase "wherein the capping agent comprises $M_xO_y(OH)_z^{11}$, wherein M is selected from the group consisting of B, Al, P, S, V, Zn, Ga, Ge, As, Se, Nb, Mo, Cd, In, Sn, Sb, Te, Ta and W" may thus in an embodiment refer to a combination of (two or more) different capping agent, such as a combination of $Zn(OH)_4^{2-}$ and $SnO_4^{2-}$. Alternatively or additionally, this may refer to the presence of two or more difference M elements in the capping agent, e.g. $(Mo,W)O_4^{2-}$, like e.g. $(Mo_{0.3}W_{0.7})O_4^{2-}$.

The capping agents may especially be introduced as salts of alkaline ions, such as salts of one or more lithium, sodium, potassium and rubidium, especially or one or more or sodium and potassium, even more especially of sodium. Positively charged capping agents may especially be provided as in combination with a halogen ion, such as one or more of fluoride, chloride and bromide.

Especially, an outer layer of the quantum dots and the inorganic capping agent have an element in common. Hence, e.g. a sulfide or selenide comprising outer layer (such as ZnS or ZnSe) may well be combined with the sulfate ($SO_4^{2-}$) or sulfite ion ($SO_3^{2-}$), or selenate ion, respectively, and a zinc containing outer layer (such as ZnS or ZnSe) may well be combined with the zincate ion. Assuming a zinc selenide outer layer, the capping agent may e.g. comprise one or more of the zincate ion and the selenate ion. Hence, especially, the inorganic ligands and the outer layer of the QD have an element in common (see also above). Further, especially the outer layer may comprise ZnS, CdS, ZnO, ZnSe or ZnP. Hence, assuming the outer layer to includes ZnS, CdS, ZnO, ZnSe or ZnP, the ligand or capping agent may include one or more of Zn and/or S, Cd and/or S, Zn and/or O (especially Zn), Zn and/or Se, or Zn and/or P, respectively.

The luminescent material with the inorganic capping ligands is in general provided in a first stage in an aqueous liquid (herein also indicated as first liquid); the method to produce such quantum dot material is further elucidated below. Hence, the luminescent material may in an embodiment comprise a first liquid comprising said quantum dots with capping agent coordinating to the quantum dots. This luminescent material may be a solution, with the QDs substantially (completely) dispersed. However, the luminescent material may also be a dispersion or colloid or gel. In a specific embodiment, the first liquid may have a pH of at least 8, such as at least 10. Applications of such luminescent material may include lighting application wherein the luminescent material is enclosed in a vessel or cuvette like body or another envelope. However, the luminescent material when dissolved in an aqueous liquid may also be used for biological applications, including medical applications, for instance as biomarkers. Other options include photovoltaic applications or photodiode applications.

In yet another embodiment, the luminescent material substantially comprises the QDs with the capping agents per se. For instance, the QDs may be separated from the liquid with techniques known in the art, including evaporation of the liquid, etc., thereby providing the QDs (including capping) agents as powder or cake. Subsequently, the thus obtained material may be further processed (see also below) into e.g. particulate material. For instance, the luminescent material may also be provided as coating on a substrate. The luminescent material substantially comprising the QDs with the capping agents per se may also be encapsulated in a matrix (see also below), such as an inorganic or organic matrix, to provide e.g. a wavelength converter element.

In yet a further embodiment, the quantum dots in the first liquid are enclosed in larger particles, and then provided as solid material, especially via a precipitation reaction; the method to produce such the quantum dot material is further elucidated below. Hence, in a specific embodiment, the luminescent material comprises particles having an inorganic (salt) matrix hosting the quantum dots with inorganic capping agents. In yet a further embodiment, the luminescent quantum dots have an outer layer comprising an inorganic compound, wherein the inorganic capping agents especially M (of the capping agent) is selected from the group consisting of Al, V, Zn, As, Se, Mo, Sn, and W, even more especially M is selected from the group consisting of Al, V, Zn, Mo, Sn, and W. For instance, yet even more especially the capping agent comprises one or more of the aluminate ion (such as $Al(OH)_4^-$), the stannate ion (such as $SnO_3^-$, $SnO_3^{2-}$, and $SnO_4^{4-}$), (the arsenate ion (such as $AsO_4^{3-}$, $AsO_3^{3-}$), the selenate ion (such as $SnO_4^{2-}$)), the vanadate ion (such as $VO_3^-$, $VO_4^{3-}$), the molybdate ion (such as $MoO_4^{2-}$), the tungstate ion (such as $WO_4^2$) and the zincate ion (such as $Zn(OH)_4^{2-}$), and wherein especially one or more of the following applies (i) the inorganic salt of the inorganic (salt) matrix and an outer layer of the quantum dots have an element in common, (ii) the inorganic capping agent and the inorganic (salt) matrix have an element in common, and (iii) an outer layer of the quantum dots and the inorganic capping agent have an element in common. Hence, e.g. a selenide comprising outer layer may well be combined with the selenate ion and a zinc containing outer layer may well be combined with the zincate ion (see also above). Assuming a zinc selenide outer layer, the capping agent may e.g. comprise one or more of the zincate ion and the selenate ion. Likewise, especially the inorganic ligands and the precipitated salt have an element in common, such as a metal element and/or a group Va element and/or a group VIa element.

As indicated above, the invention also provides a method for the production of the QDs with inorganic capping agents as defined above in a liquid per se, as well as a method including incorporation of such quantum dots in a salt matrix. These methods will further be elucidated below.

In a further aspect, the invention (thus) also provides a method for the production of a luminescent material based on quantum dots, the method comprising: (i) providing luminescent quantum dots with an organic capping agent (such as oleate) and providing in an exchange process said luminescent quantum dots with the inorganic capping agent in the first liquid, wherein the capping agent comprises $M_xO_y(OH)_z^n$, wherein M is selected from the group consisting of B, Al, P, S, V, Zn, Ga, Ge, As, Se, Nb, Mo, Cd, In, Sn, Sb, Te, Ta and W, wherein x≥1, y+z≥1, and wherein n indicates a positive or negative charge of the capping agent. With such method, advantageously above-mentioned luminescent material may be provided. Hence, in a further embodiment, the invention also provides the luminescent material as defined herein, obtainable by a method as defined above. In an embodiment, the quantum dots with inorganic ligands may be obtainable by a method comprising providing luminescent quantum dots with an organic capping agent and providing in an exchange process the luminescent quantum dots with an inorganic capping agent (in the starting liquid).

In a specific embodiment, the exchange process comprises a phase transfer process. With such process, which is further described below, efficiently the organic ligands may be replaced by the inorganic ligands (capping agents). In yet a further specific embodiment, the inorganic capping agents comprise one or more of the aluminate ion (such as $Al(OH)_4^-$), the stannate ion (such as $SnO_3^-$, $SnO_3^{2-}$, and $SnO_4^{4-}$), (the arsenate ion (such as $AsO_4^{3-}$, $AsO_3^{3-}$), the selenate ion (such as $SeO_4^{2-}$)), the vanadate ion (such as $VO_3^-$, $VO_4^{3-}$), the molybdate ion (such as $MoO_4^{2-}$), the tungstate ion (such as $WO_4^{2-}$) and the zincate ion (such as $Zn(OH)_4^{2-}$). Alternatively or additionally, a phosphor based agent, such a phosphate ion $PO_4^{3-}$. Good results were e.g. obtained with the phosphate ion.

Hence, in a further embodiment, the method comprises: (i) providing luminescent quantum dots with an organic capping agent and providing in an exchange process (especially a phase transfer process) the luminescent quantum dots with an inorganic capping agent in the first liquid. Hence, one may start with organic ligands on the QDs, but these are exchanged for inorganic ligands in the exchange process. In such exchange process the quantum dots, which are capped with organic ligands, are subjected to a treatment wherein the organic capping agents ("ligands") are replaced by inorganic ligands.

In such phase transfer process, the QDs with organic ligands are dissolved in an (apolar) organic liquid (such as heptane or toluene) and the inorganic ligands are dissolved in another liquid that is (substantially) not miscible with the organic liquid. The other liquid may for instance be water or another polar solvent. Phase transfer processed are known in the art, e.g. in the field of catalysis. Examples of polar solvents are e.g. ethyl acetate, tetrahydrofuran (THF), dichloromethane, acetone, acetonitrile (MeCN), dimethylformamide (DMF), dimethyl sulfoxide (DMSO), acetic acid, n-butanol, isopropanol, n-propanol, ethanol, methanol, formic acid, formamide (FA; also known as methanamide), and water. Combinations of two or more polar solvents may also be applied (see also above). Hence, the exchange is typically done via a phase transfer process: the original qdots in their organic solvent are combined with the inorganic ligand which is dissolved in some polar solvent (e.g. water, formamide) resulting in a 2-phase system. This system is then thoroughly mixed (stirred, shaken, sonicated, etc.) for some time, during which the original organic ligands are replaced by the inorganic ligands and the qdots migrate to the polar phase. The original ligand remains in the organic phase and may e.g. be removed by washing with an organic solvent (or another separation process). The inorganic-ligand-exchanged qdots are e.g. precipitated by adding a polar non-solvent (e.g. acetonitrile or ethanol) and separated from the liquid, e.g. by centrifugation. The liquid added is thus especially a liquid that facilitates the precipitation of the inorganic-ligand-exchanged qdots. After discarding the supernatant with the excess of inorganic ligand, the qdots may be redispersed in the polar solvent of choice (e.g. water). This latter liquid may be used as (or may be the basis of) the first liquid. The organic solvent is herein also indicated as second liquid. Especially, the polar solvent (which is used for the inorganic ligands), i.e. the first liquid, is alkaline.

In this way, the luminescent quantum dots with inorganic capping agents in the first liquid can be provided. The first liquid may especially be water or another polar solvent. However, other solvents are also possible. The choice of the liquid may depend upon the desired salt that is to be co-precipitated. The first liquid may also be a combination of liquids. A function of the first liquid is to provide a liquid wherein the quantum dots with inorganic ligands are well dispersed.

As indicated above, when the luminescent quantum dots with inorganic capping ligands is provided, the optional precipitation process may be started. With two or more salts that are (individually) soluble in the first liquid, but form together a badly soluble salt, precipitated material will be formed. Hence, the method of the invention also includes precipitating in a co-precipitation process an inorganic salt comprising precipitated material from the first liquid. The precipitated material comprises the quantum dots hosted by the co-precipitated inorganic salt. Hence, for the co-precipitation, at least two salts may be used. One or more of these salts may have an element in common with the outer layer of the quantum dots (see also below). With the co-precipitation, a substantial part of all quantum dots may precipitate. Hence, the phrase "wherein the precipitated material comprises said quantum dots" does not imply that all the quantum dots in the first liquid are comprised by the precipitated material. The precipitated material may comprise beads of quantum dots enclosed by the precipitated salt. Hence, the inorganic (salt) matrix hosts the quantum dot. The precipitated material may comprise nanospheres of about 30-60 nm in diameter. These nanospheres may host a single (or a plurality of) quantum dot(s).

As already indicated above, it appears beneficial when there is chemical or physical similarity between the outer layer (see also below) of the quantum dots and the matrix in which the quantum dots are hosted, i.e. the co-precipitated salt. For instance, especially the luminescent quantum dots have an outer layer, wherein in the co-precipitation process two or more salts ($M_1$-$A_1$); $M_2$-$A_2$) are applied, wherein at least one of the salts and the outer layer have an element in common. Here, $M_1$ symbolizes the one or more cations of a first salt, $M_2$ symbolized the one or more cations of the second salt, $A_1$ indicates the one or more anions of the first salt and $A_2$ indicates the one or more anions of the second salt. For instance, assuming a zinc sulfide coating on the quantum dot (i.e. a ZnS outer layer), a $M_1$ cation may be zinc and an $A_2$ anion may be sulfide, such as the combination of zinc chloride and sodium sulfide. Both may independently solve well in water, but when combined, zinc sulfide (co-)precipitates. When such co-precipitation is done in the presence of dispersed quantum dots, a precipitation is formed that includes quantum dots. A mechanism may be that on the outer layer of the quantum dots the co-precipitate formation starts, leading to particles that precipitate. Co-precipitation may for instance be facilitated by increasing or decreasing the temperature, dependent upon the type of co-precipitation. Further, co-precipitation may also be facilitated by adding a non-solvent, etc. the co-precipitated salt may e.g. be symbolized by $M_1$-$A_2$ or $M_2$-$A_1$. The notation $M_1$-$A_1$ is chosen to include all kind of cation-anion combinations. The independent starting salts $M_1$-$A_1$ and $M_2$-$A_2$ are independently well solvable in the first liquid, i.e. the starting salts and the first liquid are chosen in such a way that the salts independently are well soluble, such as at least 0.05 g/l at RT, especially at least 0.1 g/l, even more especially at least 1 g/l, even more especially at least 5 g/l, yet even more especially at least 10 g/l at RT. The solubility of $Na_2S$ e.g. is about 47.5 g/l in water at RT.

In yet a further embodiment, in the method one or more of the following applies (i) one or more of the at least two salts that are used for the co-precipitation and the outer layer have an element in common, (ii) the inorganic capping agent and the inorganic (salt) matrix have an element in common, and (iii) an outer layer of the quantum dots and the inorganic capping agent have an element in common. Hence, the precipitated salt and the outer layer may have an element in common. Especially, they may have a metal element in common. However, they may also have a group Va (group 15) or a group VIa (group 16) element in common. In the example of a ZnS precipitated salt on an outer layer of ZnS, the precipitated salt and the outer layer have both a metal element (Zn) and a group VIa element (S) in common. In addition to or instead of one or more elements in common, also precipitation salts are of interest which have a lattice match with the outer layer of the QDs.

As indicated above, the first liquid may also be a combination of liquids. When such above indicated non-solvent is added to improve or speed up co-precipitation, this non-solvent may also be comprised by the first liquid.

It appears that with the present method stable luminescent material can be provided. For instance, (co-precipitation) salts can be chosen that co-precipitate in stable and/or non-hygroscopic salts. Further, also salts may be chosen that provide a co-precipitate product that matches the lattice of an outer layer of the QD. Especially, it may be possible to choose a co-precipitation of a salt that is identical to the outer layer material of the QD. The quantum dots, or more precisely their outer layer, may function as nucleation layer on which the precipitation salt grows which leads to precipitation.

The salts that are chosen provide in the first liquid, especially water, form (in the first liquid) a precipitation salt (i.e. the inorganic matrix in which the QD (with inorganic ligands) is embedded). In other words, two or more soluble salts are chosen that will form a precipitation in the first liquid. Hence, the two or more salts that are applied in the co-precipitation process form a salt that is relatively badly soluble in the first liquid (even though the individual salts may solve very well in the first liquid). Hence, the phrase "precipitating in a co-precipitation process an inorganic salt comprising precipitated material from the starting liquid" especially indicates that when the coprecipitation starts, the starting liquid comprises two or more salts that can coprecipitate as well as the quantum dots (with inorganic capping agent). The salt thus formed may also be a mixed salt (or mixed crystal).

Especially, solubility of the precipitation salt is lower than 0.1 mol/l, even more especially lower than 0.01 mol/l, even more especially lower than 0.001 mol/l, yet even more especially less than 0.0001 mol/l, in water at room temperature. This also implies that the precipitation salt or inorganic matrix will in general not be chosen from the group of salts like LiCl, NaCl, KCl, LiBr, NaBr, KBr, LiI, NaI, KI, $Li_2SO_4$, $Na_2SO_4$, $K_2SO_4$, $NaNO_3$, $Na_3PO_4$, $MgCl_2$, $MgBr_2$, $CaCl_2$, $CaBr_2$, $BaCl_2$, $Sr(NO_3)_2$, $Ba(NO_3)_2$, $Al(NO_3)_3$, $AlCl_3$, $SrCl_2$, $ZnCl_2$, $SnCl_2$, $CdCl_2$, potassium sodium tartrate, etc. Of course, one or more of these salts may be used a precursor(s) for the insoluble salt for an inorganic matrix.

As mentioned above, the solubility of the two or more salts that are used to form the co-precipitated inorganic salt (matrix) may be good, and may especially be at least 0.1 mol/l, even more especially at least 0.5 mol/l, such as at least 1 mol/l. An example of well soluble salts that form a precipitate in water are e.g. zinc chloride and sodium sulfide, that precipitate in water into zinc sulfide.

The first liquid is especially an aqueous liquid, such as a liquid comprising at least 50% water, like at least 95% water, or substantially only water. However, also other liquids may be used as first liquid, such as especially other polar liquids, such as DMSO (dimethyl sulfoxide), DMF (dimethyl formamide), methyl formamide, formamide, methanol, ethanol, etc. (see further polar solvents also mentioned below). Good results were e.g. obtained with formamide. Of course, also combinations of two or more (polar) liquids (optionally including water), may be applied (as first liquid). Hence, in an embodiment the starting liquid is substantially water free. In such embodiment, the coprecipitation is especially also executed in a substantially water free environment, such as in an inert atmosphere. Examples of inert atmosphere may be $N_2$, Ar, He, etc., which may e.g. be applied in a glovebox.

Further, due to the substantial absence of organic material, such as less than 1 wt. % relative to the total weight of the luminescent material, especially less than 0.1 wt. %, or such as the amount of organic capping agents being less than 1 wt. % relative to the total weight of quantum dots, the stability of the luminescent material under severe optical conditions may be very good. Hence, an all-inorganic luminescent material may be provided with high quantum efficiency and high stability. With the present invention, for the first time an all-inorganic micro (particulate) luminescent material based on quantum dots is provided, that may be efficient and that may be stable against water and/or oxygen. The quantum dots appear to be well shielded, whereas quantum efficiency is not (substantially) affected by the encapsulation method as described herein.

In a specific embodiment, the luminescent quantum dots have an outer layer, especially comprising ZnS and the at least two salts especially comprise a first zinc salt and a second non-zinc salt, wherein the first zinc salt comprises a zinc cation and wherein the second non-zinc salt comprises an anion, and wherein the zinc cation and the anion form an insoluble salt in the first liquid. In such embodiment, when the first liquid is water, a zinc sulfide (ZnS; zinc blende) co-precipitated may be formed enclosing the quantum dots. The term "non-zinc salt" refers to a salt not comprising zinc.

The invention is however not limited to the above indicated ligands. Further, ligands that may be used may for instance also be selected from the group consisting of $ZnCl_4^{2-}$ (tetrachlorozincate) and $Zn(NO_3)_4^{2-}$ (tetranitratozincate). Ligands that may be used may for instance also be selected from the group consisting $SnO_3^-$, $SnO_3^{2-}$, and $SnO_4^{4-}$. Yet further ligands that may be used may for instance be selected from the group consisting of phosphor based groups (ligands), such as $PO_3^{3-}$, $PO_4^{3-}$ (phosphate), $POCl_3$, $P_2O_7^{4-}$, $P_3O_{10}^{5-}$, and indium based groups (ligands). Optionally, the ligands that may be used may for instance also be selected from the group consisting of cadmium based groups (ligands), such as $Cd(OH)_4^{2-}$. However, also $OH^-$ may be applied (as inorganic capping ligand). Of course, combination of two or more (inorganic capping) ligands may be applied. Hence, composite anions comprising one or more of P, Cd, Zn, Sn, S, As, Ti, Sb, Se, Te, In, etc., such as e.g. mentioned above (like $Zn(OH)_4^{2-}$, $SnO_3^-$, or $PO_3^{3-}$, etc.) may be of relevance. However, also cations may be used as ligands. Further, not only charged ligands or capping elements can be used. Also neutral capping elements may be applied. The term "capping ligand" or "capping element" may also refer to a plurality of different capping ligands. Hence, the term "a capping ligand" is used to indicate that there is at least one type of capping ligands (associated with the outer layer).

Especially, the inorganic ligand and the precipitated salt (or the salt to be precipitated) are chosen to provide and enclosure of the quantum dot which may have no or a low lattice mismatch with the outer layer of the quantum dot (see also above), especially after sintering or annealing (see below).

After the ligand exchange, and optionally after co-precipitation, in a separation process the (precipitated) material may be separated from the first liquid and said (particulate) luminescent material may be provided. This may be done with processes known in the art like filtering, decanting, centrifuging (and decanting), etc. Further, the thus obtained material may be washed and/or dried. In general, a drying process is included.

The quantum dots after ligand exchange may be embedded in an inorganic matrix. Hence, the invention also provides a method for the production of a luminescent material based on quantum dots, the method comprising: (i) providing luminescent quantum dots with an organic capping agent and providing in an exchange process said luminescent quantum dots with the inorganic capping agent in a first liquid, wherein the capping agent comprises $M_xO_y(OH)_z^n$, wherein M is selected from the group consisting of B, Al, P, S, V, Zn, Ga, Ge, As, Se, Nb, Mo, Cd, In, Sn, Sb, Te, Ta and W, wherein $x \geq 1$, $y+z \geq 1$, and wherein n indicates a positive or negative charge of the capping agent, and (ii) embedding the luminescent quantum dots with the inorganic capping agent in an inorganic matrix. To embed the luminescent quantum dots with the inorganic capping agent, amongst others an coprecipitation process may be applied, although also other processes may be applied. In this way a solid luminescent material may be provided, that is particulate or that can be made particulate. Hence, the method of the invention may also include particulating the luminescent quantum dots with the inorganic capping agent embedded in the inorganic matrix. Before embedding the luminescent quantum dots with the inorganic capping agent in the inorganic matrix (or host matrix), the quantum dots may be separated from the (first) liquid by techniques known in the art, including (co)precipitation and removing the precipitate or the liquid.

The thus obtained material (obtainable by a method including a coprecipitation or another method) may be treated further, for instance to get at more homogeneous particle size or to get a larger or smaller particle size. Hence, drying, pressing, grinding, sieving, sintering, annealing etc. may be part of a further processing. Therefore, in a specific embodiment, subsequent to the separation process the precipitated material is further subjected to a process for providing (particulate) luminescent material with especially a number averaged particle size in the range of 0.5-40 μm.

Sintering and annealing may improve the stability because crystallinity (of especially the precipitated) salt may be improved. Also the connection between the qdots and the surrounding precipitated salt may hereby be improved, in the case of the coprecipitation method.

After sintering and/or annealing, the material may be further processed to provide providing (particulate) luminescent material with especially a number averaged particle size in the range of 0.5-40 μm. The particle size may e.g. be evaluated with SEM or TEM, or optionally with other techniques known in the art like laser scattering. In a specific embodiment, annealing may be done in a temperature range of at least 150-400° C., such as especially 200-350° C. Further, (such) annealing may especially be done in an inert or ambient air. Good results were surprisingly obtained in ambient air, especially up to a temperature in the range of 250-350° C. Further, the material after co-precipitation (and separation) may be compacted, such as amongst others by annealing and/or pressing, tableting, etc., e.g. to obtain the above indicated particulate material.

Of course, the method of the invention may also be applied to provide a ((precipitated) salt) matrix with different types of quantum dots. For instance, this may be achieved when the first liquid comprises different types of quantum dots. Hence, in an embodiment the invention also provides a method wherein at least two different types of luminescent quantum dots are provided, wherein the different types of luminescent quantum dots have different emission spectra upon excitation with blue or UV light. As indicated above, the matrix comprises the co-precipitated salt with the QD('s) embedded therein. The matrix may also be a combination of different matrix salts (that are co-precipitated together).

In yet a further embodiment, the luminescent material is further enclosed in a host material (a primary matrix in the case of non-coprecipitated material and a secondary matrix in the case of coprecipitated material), to provide e.g. a layer (such as a film) or a body. This host material may thus e.g. comprise a plurality of particles of the particulate luminescent material. This host material may especially be a transmissive host material, and may be of inorganic or organic character. For instance, the host material may comprise one or more materials selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethylene terephthalate (PET), (PETG) (glycol modified polyethylene terephthalate), PDMS (polydimethylsiloxane), and COC (cyclo olefin copolymer). However, in another embodiment waveguide may comprise an inorganic material. Preferred inorganic materials are selected from the group consisting of glasses, (fused) quartz, transmissive ceramic materials, and silicones. Also hybrid materials, comprising both inorganic and organic parts may be applied. Especially preferred are PMMA, transparent PC, silicone, or glass as material for the waveguide. Especially, silicone may be of interest, but also PDMS and polysilsesquioxane.

Hence, the (particulate) luminescent material may be embedded in such host material. In an embodiment, a LED dome comprises such host material (secondary matrix), with the (particulate) luminescent material embedded therein. Hence, the invention also provides a wavelength converter element comprising a host material with the (particulate) luminescent material, as defined herein or obtainable by the method as defined herein, embedded therein.

The host material per se, the precipitated salt per se, and the ligands per se, as described herein, will in general be non-luminescent under blue and/or UV irradiation. However, in other embodiments, one or more of these may also be luminescent under blue and/or UV radiation. The quantum dots contained therein however may provide the (desired) luminescence.

Hence, the invention also provides a wavelength converter element comprising a host material with the (particulate) luminescent material embedded therein. Further, the invention also provides a method as defined herein for the production of luminescent material, wherein the method further comprises enclosing the luminescent material in the host material (to provide a wavelength converter element). As indicated above, this wavelength converter element may e.g. be (configured as) a layer, such as a film, especially a polymeric layer, or a body, such as a dome. Alternatively or additionally, the wavelength converter may also be (configured as) a lens or reflector. Hence, for instance once the powder of QDs in the precipitated salt, such as e.g. ZnS, has been produced one can easily mix that powder into another, secondary matrix such as silicones, e.g. to dispense it onto an LED (die). In other words, another benefit, next to the stability, of this approach is that an improved processability of the QDs is provided by making it a micropowder, instead of a nanopowder. It may be treated as any other conventional phosphor. Hence, one of the products herein described is a luminescent material based on quantum dots which are encapsulated in an inorganic salt. Such particulate luminescent material can be mixed in conventional LED matrix materials such as silicones. This means the QD material is much easier to process, and similarly processable as conventional phosphors. The powder may e.g. be mixed with e.g. YAG:Ce powder to make processing even easier. However, also other (conventional) phosphors may be conceivable. Hence, the new luminescent material can be used and processed as conventional particulate luminescent material, without the need for additional sealing.

In yet a further aspect, the invention provides a (particulate) luminescent material based on quantum dots, wherein the quantum dots have inorganic capping agents, wherein the luminescent material comprises particles optionally having an inorganic (salt) matrix hosting the quantum dots with inorganic capping agents. Especially, the invention also provides a (particulate) luminescent material based on quantum dots, wherein the quantum dots have inorganic capping agents, wherein the (particulate) luminescent material comprises particles optionally having an inorganic (salt) matrix hosting the quantum dots with inorganic capping agents (wherein the luminescent quantum dots have an outer layer), and wherein especially the inorganic salt of the optional inorganic (salt) matrix and an (the) outer layer (of the quantum dots) have a cation in common.

The luminescent material thus obtained—after coprecipitation—may be particulate or may be made particulate (with methods known in the art, such as including, but not limited to, grinding (see also above)). In further embodiments, the luminescent quantum dots are dispersed within particles of the luminescent material. Further, especially the particles, especially of the coprecipitated luminescent material, may have a number averaged particle size in the range of 0.5-40 µm, such as especially 1-30 µm, even more especially 1.5-25 µm. The particles may be conglomerates of smaller particles, such as in the order of about 50 nm (see also above). The (particulate) luminescent material may comprise in the range of 0.001-25 wt. %, especially 0.1-5 wt. %, quantum dots relative to the total weight of the (particulate) luminescent material. With the co-precipitation process, such particles may be relatively easily made.

Especially, the luminescent material may be produced by the method as described herein. Hence, in a further embodiment the (particulate) luminescent material is obtainable by the method as defined herein.

In yet a further aspect, the invention also provides a lighting device comprising a light source and a (particulate) luminescent material as defined in herein, wherein the light source is configured to illuminate the (particulate) luminescent material. Here, the QDs, are applied as wavelength converter nanoparticles. The luminescent material is thus especially arranged as wavelength converter, configured to convert at least part of the light source light into luminescent material light.

In further embodiments, the quantum dots are of the core-shell type, especially with a shell comprising ZnS. Further, especially the inorganic (salt) matrix (thus) hosting the quantum dots with inorganic capping agents also comprises ZnS.

The term "quantum dots" or "luminescent quantum dots" may also refer to a combination of different type of quantum dots, i.e. quantum dots that have different spectral properties. The QDs are herein also indicated as "wavelength converter nanoparticles". The term "quantum dots" especially refer to quantum dots that luminesce in one or more of the UV, visible and IR (upon excitation with suitable radiation, such as UV radiation). The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AlN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) $LiAsSe_2$, $NaAsSe_2$ and $KAsSe_2$. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, $CuInS_2$, $CuInSe_2$, CdTe, CdSe, CdSeTe, $AgInS_2$ and $AgInSe_2$. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle.

In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1 to about 20 nm. In an embodiment, nanoparticles have an average particle size in a range from about 1 to about 10 nm.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or $CuInSe_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of" is applied in some of the above lists of quantum dot materials. The term "core-shell" may also refer to "core-shell-shell", etc., including gradient alloy shell, or dots in rods, etc.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material.

In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors.

In an embodiment, semiconductor nanocrystals preferably have ligands attached thereto, such as e.g. described in WO 2011/031871. In an embodiment, the ligands can be derived from the coordinating solvent used during the growth process. In an embodiment, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, carboxylic acids, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

More specifically, the coordinating ligand can have the formula:

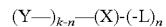

wherein k is 2, 3 4, or 5, and n is 1, 2, 3, 4 or 5 such that k-n is not less than zero; X is O, OS, O—Se, O—N, O—P, O—As, S, S=O, $SO_2$, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl. Further ligands may especially be one or more of oleic acid, and tri-octyl phosphine, and tri-octyl phosphine oxide. Hence, ligands may especially be selected from the group of acids, amines, phosphines, phosphine oxides and thiols.

A suitable coordinating ligand can be purchased commercially or prepared by ordinary synthetic organic techniques, for example, as described in J. March, Advanced Organic Chemistry. Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated by reference in its entirety. Other examples of ligands include benzylphosphonic acid, benzylphosphonic acid including at least one substituent group on the ring of the benzyl group, a conjugate base of such acids, and mixtures including one or more of the foregoing. In an embodiment, a ligand comprises 4-hydroxybenzylphosphonic acid, a conjugate base of the acid, or a mixture of the foregoing. In an embodiment, a ligand comprises 3,5-di-teri-butyl-4-hydroxybenzylphosphonic acid, a conjugate base of the acid, or a mixture of the foregoing. Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand and Method", each of the foregoing being hereby incorporated herein by reference.

The above described organic ligands are ligands with which the QD may start, e.g. in an organic solvent, and which may be exchanged in the exchange process to inorganic ligands.

The wavelength converter or wavelength converter element (or more precisely the wavelength converter nanoparticles) is (are) radiationally coupled to the light source (or, as indicated above, a plurality of light sources). The term "radiationally coupled" especially means that the light source and the wavelength converter are associated with each other so that at least part of the radiation emitted by the light source is received by the wavelength converter (and at least partly converted into luminescence). The term "luminescence" refers to the emission which emits the wavelength converter nanoparticles emit upon excitation by the light source light of the light source. This luminescence is herein also indicated as converter light (which at least comprises visible light, see also below).

The wavelength converter will in general also be configured downstream of the light source. The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The device is especially configured to generate device light, which at least partly comprises the converter light, but which may optionally also comprise (remaining) light source light. For instance, the wavelength converter may be configured to only partly convert the light source light. In such instance, the device light may comprise converter light and light source light. However, in another embodiment the wavelength converter may also be configured to convert all the light source light.

Hence, in a specific embodiment, the lighting device is configured to provide lighting device light comprising both light source light and converter light, for instance the former being blue light, and the latter comprising yellow light, or yellow and red light, or green and red light, or green, yellow and red light, etc. In yet another specific embodiment, the lighting device is configured to provide only lighting device light comprising only converter light. This may for instance happen (especially in transmissive mode) when light source light irradiating the wavelength converter only leaves the downstream side of the wavelength converter as converted light (i.e. all light source light penetrating into the wavelength converter is absorbed by the wavelength converter).

The term "wavelength converter" may also relate to a plurality of wavelength converters. These can be arranged downstream of one another, but may also be arranged adjacent to each other (optionally also even in physical contact as directly neighboring wavelength converters). The plurality of wavelength converters may comprise in an embodiment two or more subsets which have different optical properties. For instance, one or more subsets may be configured to generate wavelength converter light with a first spectral light distribution, like green light, and one or more subsets may be configured to generate wavelength converter light with a second spectral light distribution, like red light. More than two or more subsets may be applied. When applying different subsets having different optical properties, e.g. white light may be provided and/or the color of the device light (i.e. the converter light and optional remaining light source light (remaining downstream of the wavelength converter). Especially when a plurality of light sources is applied, of which two or more subsets may be individually controlled, which are radiationally coupled with the two or more wavelength converter subsets with different optical properties, the color of the device light may be tunable. Other options to make white light are also possible (see also below).

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light. In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs.

The invention is herein especially explained with respect to quantum dots. However, the invention may also be used for (other) luminescent nano particles or wavelength converter nano particles. The nano particles are wavelength converter nano particles, which may especially be configured to provide, upon excitation by UV and/or blue light, luminescence in at least part of the visible part of the spectrum. Hence, these particles are herein also indicated as wavelength converter nano particles, of which QDs (quantum dots) are a specific embodiment. Hence, in yet another aspect, the term QD and similar terms may be generalized to luminescent nano particles or wavelength converter nano particles. Examples are e.g. classical luminescent materials as nano particles.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or an preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

Especially, the invention provides in embodiments the use of an inorganic (ZnS) matrix to disperse (inorganic ligand) qdots in a simple way of preparing such a matrix, by a simple precipitation process from water-soluble precursor salts. Specific applications may e.g. be solid state lighting applications, most notably LED lamps with a high CRI.

The invention is especially described in relation to (semi-conductor) quantum dots. However, the invention may also be applied in relation to other type of luminescent nanoparticles or nanocrystals. Hence, in a further aspect, the invention also provides a method for the production of luminescent material based on luminescent nanoparticles, the method comprising: (i) providing luminescent nanoparticles with an inorganic capping agent in a first liquid; (ii) precipitating in a co-precipitation process an inorganic salt comprising precipitated material from the first liquid; and (iii) separating in a separation process the precipitated material from the first liquid and providing said luminescent material.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1A:
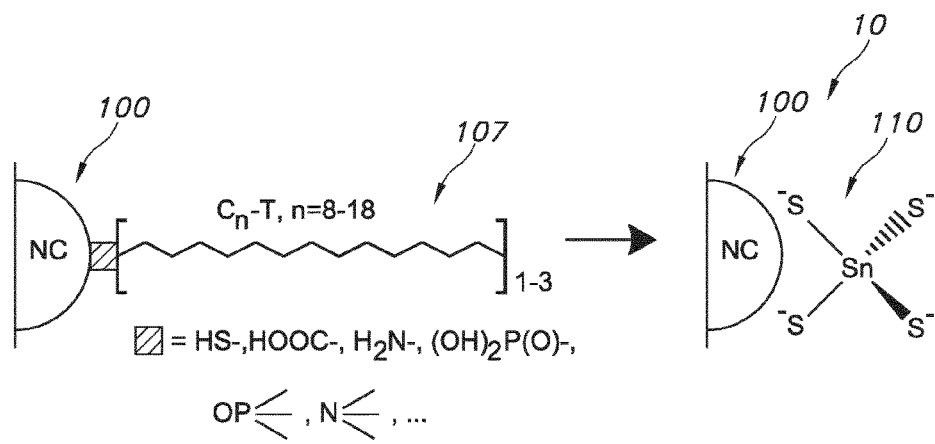
FIGS. 1a-1d schematically depict some aspects of the invention.

The schematic drawings are not necessarily on scale.

DETAILED DESCRIPTION OF THE EMBODIMENTS

Ideally, the ligand used is highly compatible with the surface of the qdots (which is in most cases ZnS), so sulphide based ligands are preferred. Some ligands are for example $S^{2-}$, $HS^-$, $SnS_4^{4-}$, $Sn_2S_6^{4-}$ but others are also possible (e.g. $Se^{2-}$, $Te^{2-}$, etc.). Generally a decrease in QE is observed upon exchanging the original organic ligands for those sulphide based inorganic ones. Relative low quantum efficiencies were found for ligands such as $Sn_2S_4^{4-}$, $S^{2-}$, $HS^-$ and $OH^-$ in aqueous systems.

What is proposed here is the use of composite anions of a different class, with the common composition of $M_xO_y(OH)_z^{n-}$ (with M being an element capable of forming oxo- or hydroxo species, see table III for examples). As a special representative of this class, the zincate ion is presented: $Zn(OH)_4^{2-}$. This in an interesting ion since normally the combination of $Zn^{2+}$ and hydroxide ion would result in the insoluble $Zn(OH)_2$. However, at very high pH (=high hydroxide concentration), this zincate ion is formed which is soluble again in water, forming an anion with a central metal ion that is also a component of the shell material most commonly used in qdots. It was observed that the high QE of the qdots with the original (organic) ligands was preserved to a large extent by using this new class of inorganic ligands. This material was also used to in a co-precipitation experiment of $ZnCl_2$ and $Na_2S$ to prepare qdots in a ZnS matrix. Below, the invention is further elucidated in view of some specific embodiments and also reference examples. For instance, the hydroxide ligand and the $Sn_2S_6^{4-}$ ligand are used as references.

The organic ligands on the quantum dots are replaced by inorganic ligands, such as sulfide based ligands (e.g. $Sn_2S_6^{4-}$ or $S^{2-}$) or zinc based ligands (e.g. $Zn(OH)_4^{2-}$, which make them dispersible in water or other polar solvents such as DSMO or formamide. The inorganic ligands are preferably highly compatible with the ZnS shell (or other shell, or non-shell outer layer material) that is found on the majority of all modern quantum dot types. After the exchange and purification, a thick ZnS layer is deposited on those qdots by a simple precipitation procedure. Aqueous solutions of two water soluble salts ($ZnCl_2$ and $Na_2S$) are mixed, that form the insoluble ZnS in situ. The ZnS ultimately forms a matrix around the qdots, thereby forming a qdot/ZnS composite that can be applied as a generic micron-sized phosphor powder that is more stable against prevailing LED conditions while there is less or no need for additional hermetic sealing.

In addition to inorganic ligand exchanged qdots as described above, any other qdot type that is water dispersable (for example mercaptopropionic acid capped qdots or silica coated qdots) can be used as starting point for this co-precipitation method to incorporate the QDs in a second inorganic matrix.

In addition to ZnS, any other inorganic material that can be formed via the solution precipitation method (i.e. 2 or more water soluble materials that combine into 1 or more water insoluble materials).

Typically, quantum dots are obtained as zinc sulphide coated nanocrystals, surrounded by organic ligands such as oleate and dispersed into an organic solvent like toluene. The first step into creating qdots with inorganic ligand in an inorganic matrix (ILIM-qdots), is to exchange those organic ligands for inorganic ones. Typically sulphide based ions are used ($S^{2-}$, $HS^-$, $SnS_4^{4-}$, $Sn_2S_6^{4-}$) but others are also possible (e.g. $OH^-$). This exchange is schematically shown in the figure below.

The ligand exchange is schematically depicted in FIG. 1a (derived from Maksym V. Kovalenko et al., JACS 2010, 132, 10085-10092), with ref. 100 indicating the quantum dot, ref 107 indicating the organic ligand, and ref 110 indicating the inorganic ligand. The ligands depicted are only shown by way of example. Other ligands, organic as well as inorganic may also be chosen. In FIG. 1a, the symbol "$C_n$-T" may indicate the hydrocarbon tail. The reference NC refers to nano crystal.

Ideally, the ligand used is highly compatible with the surface of the qdots (which is in most cases ZnS), so sulphide based ligands are preferred. In addition to inorganic ligand exchanged qdots as described above (which are preferred due to their inorganic nature), any other type of water dispersable qdots can be used as starting point for the inorganic matrix incorporation as described below. For example, qdots can also be made water soluble by exchanging the aliphatic ligands by charged ligands such as mercaptopropionic acid, or aminoethanethiol.

In addition to the inorganic and organic ligand water soluble qdots, also silica coated qdots can be incorporated with the method described below. Silica coated QDs can be obtained via the so-called reverse micelle method or Stober method and has been extensively studied (Koole et al., Chem. Mater. 2008, 20, p. 2503). However, the silica layer around qdots is amorphous, and therefore a less sufficient barrier to water and air. Thus, also silica coated qdots can be incorporated in a second, micron-sized inorganic matrix by the co-precipitation method described below. The surface of the silica coated qdots may need to be pretreated in order to act as suitable nucleation seed for the second matrix attachment.

After the ligand exchange, an inorganic matrix can be applied. Ideally, the inorganic matrix applied is highly compatible with the qdot surface and the inorganic ligand(s) used, so zinc sulphide (ZnS) is preferred, but other materials are certainly possible.

Figure 1B:
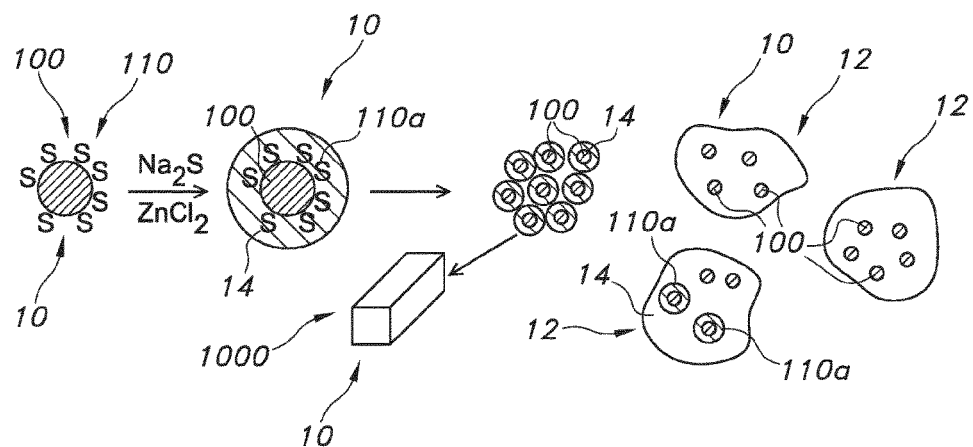

The method we apply here is using a simple precipitation approach whereby an insoluble salt (ZnS) is formed by combining two highly water-soluble salts ($Na_2S$ and $ZnCl_2$). Combining aqueous solutions of these salts will result in a swift formation of a ZnS precipitate. The combination of the other two ions should result in a soluble salt again (NaCl in this case). As the qdots are (preferably) sulphide terminated, they can act as seeds for the growth of the ZnS, thereby resulting in a relatively thick coating of the qdots with ZnS. After washing (to remove NaCl and excess reactants) and drying, a fully inorganic material containing qdots can be obtained, as is schematically shown in FIG. 1b. This figure schematically represents the formation of a thick ZnS shell around (inorganic ligand) qdots via a simple precipitation procedure. In FIG. 1b, reference 110a indicates a layer of the inorganic ligands. This layer may not be a pure layer of ligands, but there may be a gradient change of the quantum dot particle to the bulk of the matrix, with a high concentration inorganic ligands close to the QD and substantially no inorganic ligand further away from the QD. Reference 12 indicates the co-precipitated particles obtained in the process. In general, these particles may be included a plurality of quantum dots. Reference 14 indicates the matrix or matrix material (i.e. the co-precipitated salt (material) wherein the QDs are dispersed. Reference 1000 indicates a luminescent layer or body comprising (particulate) luminescent material. This is herein also indicated as wavelength converter element 1000.

Figure 1C:
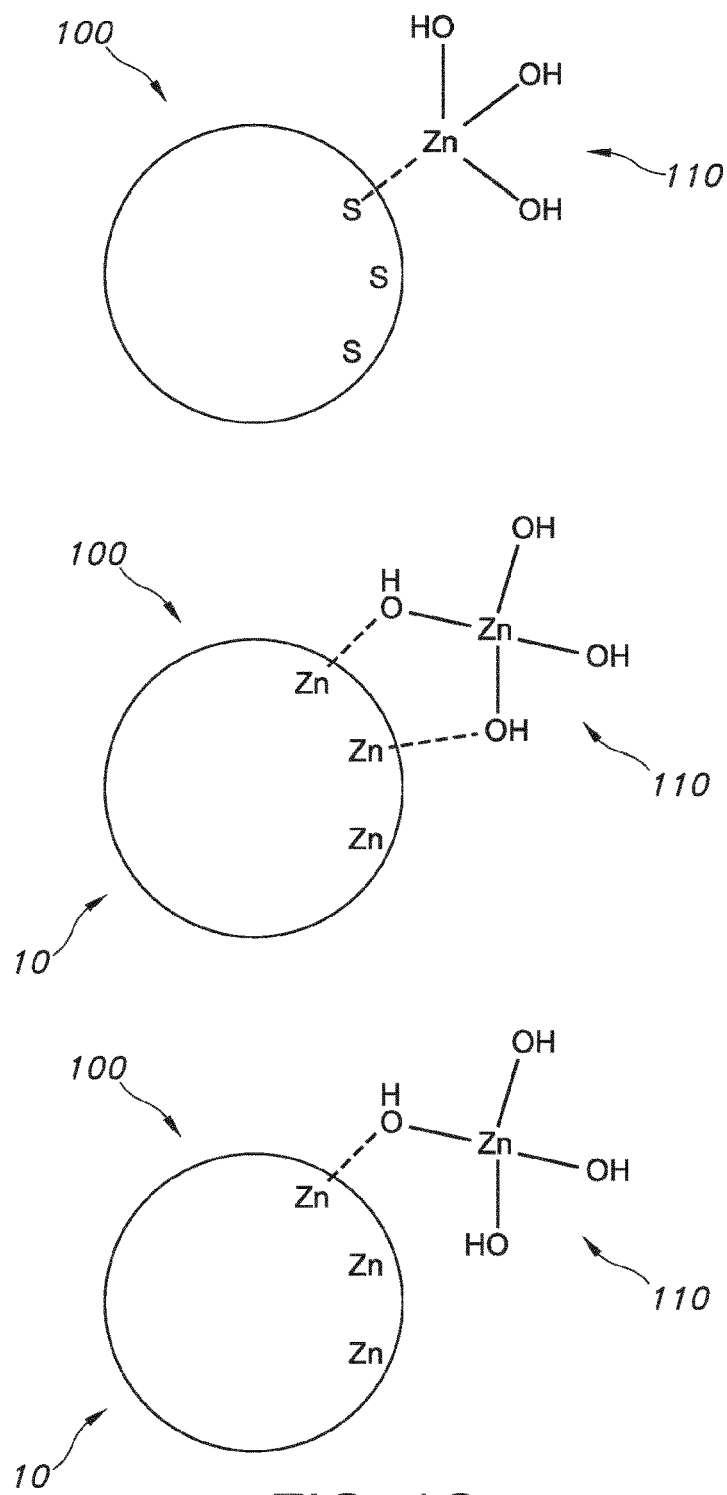
Figure 1D:
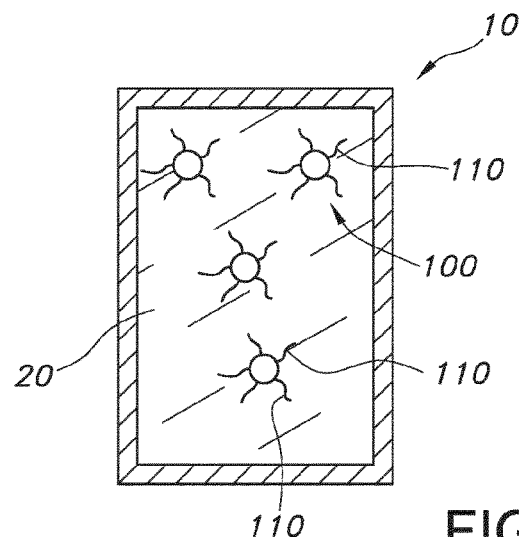

FIG. 1c schematically depicts the same as the right part of FIG. 1a, i.e. QD 100, but now with, by way of example, a zincate as capping ligand 110 coordinating to the QD. Several options are shown how the capping ligand may coordinate to the QD (cations). A (solid) luminescent material 10 will in general include a multitude of such quantum dot particles with ligands 110. Further, in reality each QD 100 will be surrounded by a plurality of ligands 110. FIG. 1d schematically depicts an embodiment of the luminescent material 10, wherein the QDs are (still) in the first liquid 20. For instance, a closed cuvette may contain the QDs 100 dispersed in the first liquid 20, with the capping agents or ligands 110 surrounding the QDs and facilitation solubility and/or dispersability. Such luminescent material may e.g. also be used in a lighting device (see below).

Figure 2A:
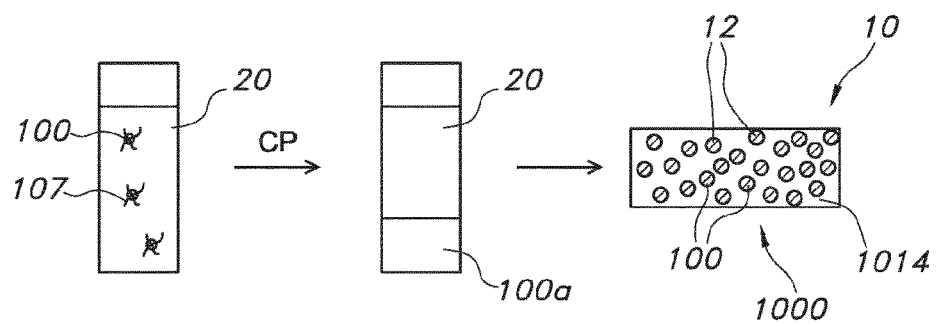
FIGS. 2a-2b schematically depict some aspects of a method for the production of the luminescent material.

FIG. 2a very schematically depicts the quantum dots 100 being dispersed via the ligands 107 in the liquid 20. After co-precipitation (CP), a layer with precipitated material is obtained. This precipitated material is indicated with reference 107. With further processing, the precipitated material may e.g. result in particulate luminescent material 10 (see FIG. 1b) or e.g. in a wavelength converter element 1000 enclosing the particular luminescent material 10 with quantum dots. The wavelength converter element may include a host material 1014, such as a silicone or PMMA, etc., which surrounds the luminescent material particles 12. Hence, the matrix material of wavelength converter element will in general be of a material that is different from the precipitated salt material.

Figure 2B:
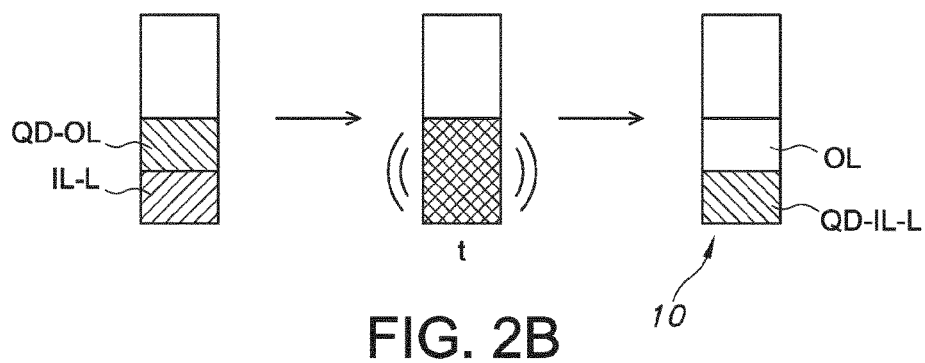

FIG. 2b schematically presents of the inorganic ligand exchange procedure with quantum dots. Here, QD refers to quantum dots, OL refers to organic liquid, IL refers to inorganic ligands, L refers to liquid (for inorganic ligands), "t" indicates time, and QD-IL-L indicates the quantum dots with inorganic ligands in the liquid. OL refers in the most right drawing/stage again to organic liquid.

Figure 3A:
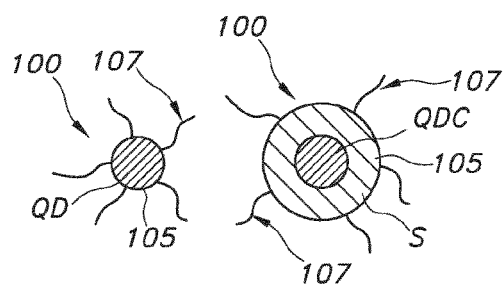
FIGS. 3a-3b schematically depict some further aspects of the invention.

FIG. 3a schematically depicts two types of quantum dots, though more types are possible (see also above), such as e.g. dot-in-rod quantum dots, which are also a type of core-shell QDs. The left QD 100 is a bare QD without shell. Here, the chemical composition of the outer layer may be substantially identical to the chemical composition of the rest of the quantum dot. The quantum dot here has organic ligands 107. The right particle is a so-called core-shell particle. The core is indicated with reference QDC and the shell, which is here also the outer layer 105, is indicated with reference S. Of course, also core-shell-shell or other type of quantum dot based particles may be applied.

Figure 3B:
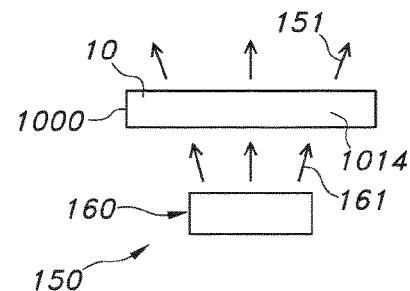

FIG. 3b schematically depicts a lighting device 150 with a light source 160, configured to generate light source light 161. This light source light 161 is at least partly received with the luminescent material 10, for instance in the form of a layer or body 1000, or comprised by such layer or body 1000. This layer or body may also be indicated as wavelength converter element (see also FIG. 2a). The luminescent material 10 is optically coupled with the light source 160. The luminescent material absorbs at least part of the light source light 161 and converts this light source light 161 into luminescent material light. The light provided by the lighting device 150 is indicated with reference 151. This lighting device light 151 may at least include the light generated by the luminescent material 10 upon said excitation with the light source light 161, but may optionally also include said light source light 161. Together, they may for instance provide white lighting unit light 151. Referring to FIGS. 2a and 3b, the invention thus also includes wavelength converter elements enclosing luminescent material particles. The luminescent particles on their turn may include a precipitated salt enclosing quantum dots. The quantum dots may include core-shell type quantum dots (or other type of quantum dots). Further, between the quantum dots and the precipitated salt material, there may be a layer this is substantially based on the inorganic ligands with which the quantum dots were stabilized in the first liquid (before co-precipitation) of the inorganic salt. The luminescent material 10 may be arranged at a non-zero distance from the light source 160, though in other embodiments the luminescent material may arranged on an emissive surface (such as a LED die) of the light source 160.

EXAMPLES

Example 1

Commercially available quantum dots from Crystalplex (CdSe/CdS/ZnS core/shell/shell) with oleate ligands (emitting at 600 nm) were subjected to an inorganic ligand exchange by adding 0.25 mL of the qdot solution (5 mg/mL in toluene) to 1.75 mL n-heptane. The polar phase was made by 0.125 mL 1M $(NH_4)_4Sn_2S_6$ in water to 2 mL of formamide (FA). The two phases were combined and stirred vigorously for 45 minutes. The organic layer was removed, and the FA phase was washed 4 times with n-heptane (1-2 mL). Finally the clear FA layer was collected and to this was added 3 mL of acetonitrile together with a few drops (ca. 15 µL) of the inorganic ligand solution to precipitate the qdots.

After centrifugation and discarding the supernatant, the dots were redispersed into 1.3 mL 20 mM $Na_2S.9H_2O$ in water. To this dispersion was added dropwise 1.3 mL of 20 mM $ZnCl_2$ in water. A precipitate was formed that took all the qdots with it, i.e. the supernatant was optically clear and virtually colorless.

The resulting material was washed 3 times with water (3 mL) to remove NaCl, 2 times with acetone to remove the water and dried in vacuo. A highly colored brittle material was obtained that showed weak luminescence under UV light. Qdot concentration was estimated at 30 wt. % which probably results in concentration quenching.

Example 2

Commercially available quantum dots (CdSe/CdS/ZnS core/shell/shell) with oleate ligands (emitting at 575 nm) were subjected to an inorganic ligand exchange by adding 0.25 mL of the qdot solution (1 mg/mL in toluene) to 2 mL n-heptane. The polar phase was 2 mL of a 5 mg/mL solution of $Na_2S.9H_2O$ in formamide (FA). The two phases were combined and stirred vigorously for 30 minutes. The organic layer was removed, and the FA phase was washed 4 times with n-heptane (1-2 mL). Finally the clear FA layer was collected and to this was added 3 mL of acetonitrile to precipitate the qdots.

After centrifugation and discarding the supernatant, the dots were redispersed into 0.25 mL of the 5 mg/mL $Na_2S$ solution in FA. The dots were still slightly agglomerated at this stage. To this dispersion was added 3 mL of water and 4 mL of 0.1 M $Na_2S.9H_2O$ in water. Subsequently, 4 mL of 0.1 M $ZnCl_2$ in water was added in a dropwise fashion, and an additional 4 mL of water. A precipitate was formed, taking all the qdots with it from the dispersion.

The resulting material was washed 3 times with water (7 mL) to remove NaCl, 2 times with acetone (7 mL) to remove the water and dried in vacuo. A salmon-pink brittle solid was obtained, that showed clear emission under UV light. The Qdot concentration was calculated at 0.6 wt. %. Quantum efficiency was measured to be 25% (original qdots dispersed in toluene were 80%). The material was gently crushed and studied under a fluorescence microscope, where it showed clear emission.

The flakes of material are glassy in appearance. They were further studied with high resolution SEM. The material was found to be composed of agglomerated nanospheres, 30-60 nm in diameter. No individual qdots (size ~6-8 nm) were observed, so it appears that all of them are coated with ZnS and actually inside the nanograins. Stability measurements have been performed (in ambient air) with good results. From the SEM pictures it seems that all quantum dots are embedded in beads (nanospheres), with often a single quantum dot in a single bead instead of a plurality of quantum dots in a single bead.

Example 3

An aqueous solution of potassium zincate ($K_2[Zn(OH)_4]$) was made by adding 3.125 mL of a 1M $ZnCl_2$ solution to 5 mL of a 10M KOH solution (both in water). The resulting solution was diluted with water to a final concentration of 0.125M in Zn and 2M in KOH.

Commercially available quantum dots (CdSe/CdS/ZnS core/shell/shell) with oleate ligands (emitting at 575 nm) were subjected to an inorganic ligand exchange by adding 1 mL of the qdot solution (5 mg/mL in toluene) to 7 mL n-heptane. The polar phase was made by adding 1.6 mL of the 0.125M $K_2[Zn(OH)_4]$ and 2M KOH to 4.8 mL 1M KOH and 1.6 mL of $H_2O$. The resulting polar phase is 8 mL of 0.0125 M $K_2[Zn(OH)_4]$ and 1M KOH. The two phases were combined and stirred vigorously for 1 hour. The organic layer was removed, and the FA phase was washed 4 times with n-heptane (1-2 mL). 1 mL of the resulting qdot dispersion was added to 12.5 mL of an aqueous 0.1M $Na_2S$ solution. Subsequently, 12.5 mL of 0.1 M $ZnCl_2$ in water was added in a dropwise fashion, and an additional 4 mL of water. A precipitate was formed, taking all the qdots with it from the dispersion.

Figure 4:
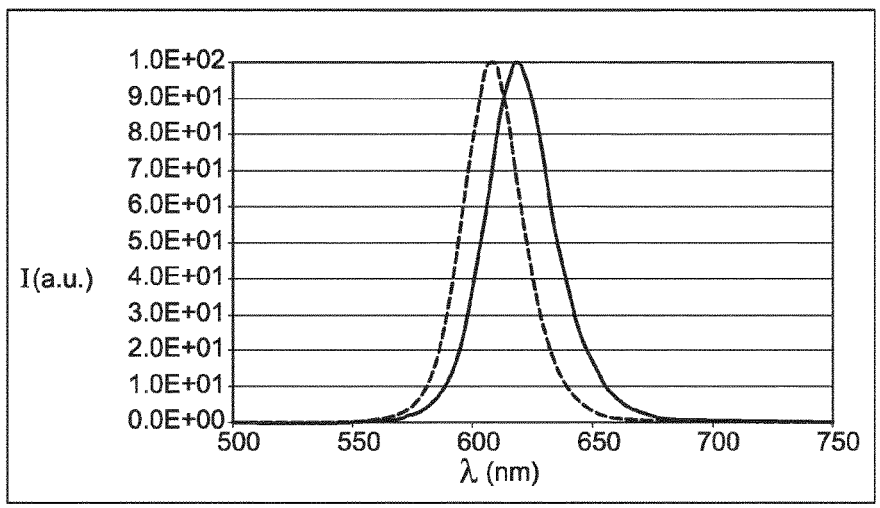
FIG. 4 depicts emission spectra of quantum dots as described herein in heptane (left curve) and the same quantum dots in a ZnS matrix.

The resulting material was washed 4 times with water (10 mL) to remove NaCl, 2 times with acetone (10 mL) to remove the water and dried in vacuo. A salmon-pink brittle solid was obtained, that showed clear emission under UV light. The Qdot concentration was calculated at 0.5 wt. %. Quantum efficiency was measured to be 56% (original qdots dispersed in toluene were 80%). FIG. 4 shows the emission spectra of quantum dots as described herein in heptane (left curve) and the same quantum dots in a ZnS matrix. In the ZnS matrix the emission is shifted to lower energy. This may be due to a ligand and/or matrix effect. The emission spectrum of the quantum dots with inorganic ligands in water was also measured. That emission spectrum was substantially the same as the emission spectrum of the quantum dots in heptane.

Example 4: $Sn_2S_6^{4-}$ Ligand

Example 4A: Reference

Commercially available quantum dots from Crystalplex (CdSe/CdS/ZnS core/shell/shell) with oleate ligands (emitting at 575 nm; QE 80%) were subjected to an inorganic ligand exchange by adding 0.25 mL of the qdot solution (5 mg/mL in toluene) to 1.75 mL n-heptane. The polar phase was made by adding 0.125 mL of a 0.1M aqueous solution of $(NH_4)_4Sn_2S_6$ to 2 mL of water. The $Sn_2S_6^{4-}$ is a ligand known in the art. The two phases were combined and stirred vigorously for 1.5 hour. The organic layer was removed, and the aqueous phase was washed 4 times with n-heptane (3-4 mL). Finally the water layer was collected. No emission was observed under UV light.

This example illustrates that a typical ligand known in the art results in a large drop in the performance of the qdots.

Example 4B

To the ligand exchanged qdot dispersion of example 4A was added 1 ml of a 10M KOH solution in water. The dots flocculated and were centrifuged off. The sediment was redispersed in 0.25 ml 1M KOH. This resulted over the course of several days in an increase in quantum yield up to 17%. In general, with the sulphide ligands known in the art, an increase in QE was observed upon adding KOH during or after the ligand exchange.

Addition of smaller amounts of KOH also results in (slow) return of the emission: addition of 100 µl 0.1M KOH to 100 µl of a qdot dispersion made similar to 4A, resulted in an increase in QE from 0.5 to 14% after 3 days.

Example 4C

Ligand exchanges were performed as in example 4A, but instead of adding 2 ml of water to the $(NH_4)_4Sn_2S_6$ solution, 2 ml of KOH solutions of various concentrations were used. After ligand exchange and washing with heptane, the QE of the aqueous layers was measured as such, after heptane washing and after sedimentation of the qdots with acetonitrile, followed by centrifugation/redispersion in water (to remove excess KOH). Results are listed in Table I, clearly showing a higher KOH concentration results in a higher QE. It is also clear that upon removing the excess of KOH the QE drops. The higher QE values after KOH removal for the higher starting concentrations of KOH are most likely due to the residual amount of KOH left in the dispersion after only one sedimentation/centrifugation/redispersion step. The QE is reduced further by repetition of this procedure. At KOH concentrations above 1M, the ionic strength of the water layer was so high the dots flocculated at the water/heptane interface.

TABLE I

QE of $Sn_2S_6^{4-}$ ligand exchanged Qdots as a function of hydroxide concentration and processing

| [KOH] (mol/l) | QE (%) after LE | QE (%) after heptane washing | QE(%) after removal of excess KOH |
| --- | --- | --- | --- |
| 0 | | | 0 |
| 0.01 | | | 0.1 |
| 0.1 | 14 | 18 | 1 |
| 0.5 | 31 | 34 | 7 |
| 1.0 | 31 | 35 | 16 |

Example 5: Hydroxide Ligand

The hydroxide ion itself was also found to be able to exchange the original organic ligands from the qdots (as is also known from prior art). A ligand exchange with as described in example 4A but with Crystalplex (CdSe/CdS/ZnS core/shell/shell) with oleate ligands (emitting at 610 nm; QE 80%) and a 1M KOH solution resulted in the qdots in the aqueous layer with a QE of 20%.

Example 6: Preparation of the Zincate Ion Solution

A stock solution of $K_2Zn(OH)_4$ in water was made by adding 3.125 mL of 1M $ZnCl_2$ to 5.0 mL of 10M KOH (both in water). The resulting mixture was diluted to 25 mL with water in a volumetric flask, affording a stock solution which is 0.125M in $Zn^{2+}$ and 2.0M in KOH.

Example 6A: Ligand Exchange with the Zincate Ion

A ligand exchange using the zincate ligand solution and commercially available quantum dots from Crystalplex (CdSe/CdS/ZnS core/shell/shell) with oleate ligands (emitting at 610 nm) was performed by using an apolar phase of 7 mL of n-heptane mixed with 1 mL of the qdot dispersion (5 mg/mL) and a polar phase consisting of 0.8 mL of the zincate stock solution and 7.2 mL of 1M KOH. The final concentrations in the polar phase were therefore 0.0125M in $Zn^{2+}$ and 1.1M KOH. Both phases were mixed and stirred vigorously for 1 hour resulting in a transfer of the qdots to the polar phase. After demixing, the organic layer was removed, and the aqueous phase was washed 4 times with n-heptane (6-8 mL). The resulting aqueous dispersion was used as is. FTIR analysis showed the virtually complete replacement of the original organic ligands (less than 0.2% of the oleate ligand was still present). The QE of this dispersion was found to be up to 60% (original QE of the starting dots was 80% in heptane or 70% in toluene).

This example illustrates that with this new ligand system it is feasible to retain the original QE of the qdots to a large extent upon ligand exchange and transfer to a polar solvent. This high was reproduced several times

Example 6B: Ligand Exchange with the Zincate Ion (II)

Commercially available quantum dots from Crystalplex (CdSe/CdS/ZnS core/shell/shell) with oleate ligands (emitting at 610 nm) were subjected to an inorganic ligand exchange by adding 1 mL of the qdot solution (5 mg/ml in toluene) to 7 ml n-heptane. The polar phase was made by adding 1.6 ml 0.125 mol/l $K_2Zn(OH)_4$ in KOH (KOH total 2 mol/l) to 4.8 mL 1.0 mol/l KOH and 1.6 ml water. This results in 8 ml polar phase with 0.025 mol/l $Zn^{2+}$ and 1 mol/l KOH. The two phases were combined and stirred vigorously for 1 hour. The organic layer was removed, and the water phase was washed 3 times with n-heptane (ca. 8 ml). The QE of this dispersion was found to be 52% (original QE of the starting dots was 80% in heptane).

An overview of ligand exchanges with various concentrations of the zincate ligand and KOH is listed in Table II. At too high concentration of zinc and/or KOH, the ligand exchanged qdots are not colloidally stable (agglomeration is observed). At too low a zinc concentration this is also observed. When the KOH concentration is too low or the zinc concentration too high, the zincate solution is not stable (precipitation of $Zn(OH)_2$ observed).

TABLE II results of ligand exchanged qdots using solutions of zincate ions, as a function of the concentration of zinc and KOH. When a value for the QE is listed, a stable dispersion of ligand exchanged qdots was obtained. QE values measured several weeks after preparation, which has resulted in a drop in QE of 10-15%.

| $[Zn^{2+}]\downarrow$/[KOH]→ | 0.25M | 0.5M | 1.0M | 2.0M |
|---|---|---|---|---|
| 0.125M | — | — | zincate solution and LE qdots not colloidally stable | — |
| 0.04 | — | — | QE = 37% | — |
| 0.0125 | QE = 37% zincate solution not stable | QE = 36% | QE = 42% | LE qdots not colloidally stable |
| 0.004 | — | — | LE qdots not colloidally stable | — |

Example 7: Stannate Ligand

Commercially available quantum dots from Crystalplex (CdSe/CdS/ZnS core/shell/shell) with oleate ligands (emitting at 610 nm) were subjected to an inorganic ligand exchange by adding 0.25 mL of the qdot solution (5 mg/ml in toluene) to 1.75 ml n-heptane. The polar phase was made by adding 50 μl 1M $Na_2SnO_3$ in water to 1.95 ml 1M KOH. The two phases were combined and stirred vigorously for 1 hour, upon which the qdots transferred to the aqueous layer. The organic layer was removed, and the water phase was washed 3 times with n-heptane (ca. 8 ml). The quantum efficiency was over 60%.

Example 8: Stannate Ligand

In another stannate example the ligand exchange was performed with the same type of quantum dots, also with oleate ligands. The apolar phase was heptane and the polar phase was 0.1 mol/l $Na_2SnO_3$ in 0.1 mol/l KOH. The ligands were exchange after 30 min stirring/shaking. As emulsion formation was observed, the mixture was centrifuged (only 5 min at 2000 RPM). The water phase orange, but turbid. The quantum efficiency (QE) was 68.7% at an emission maximum of 612.4 nm (2 h after starting the preparation).

Example 9: Stannate Ligand

In another stannate example the ligand exchange was performed with the same type of commercial quantum dots (as in Example 8), again capped with oleate ligands. The apolar phase was made by mixing 0.5 mL of the 5 mg/mL quantum dot dispersion with 1.5 mL of n-heptane. The polar phase was made by mixing 0.2 mL of an aqueous 1 M $Na_2SnO_3$ solution with 1.8 mL of water, resulting in a 0.1 M $Na_2SnO_3$ solution. The two phases were combined and shaken for 1 hour at room temperature. Some emulsion formation was observed, and the so the mixture was centrifuged (2 min at 2000 rpm) to assist the demixing. The water phase was orange but turbid. The quantum efficiency was 59% (measured same day as preparation).

Further Experiments

The organic ligands on the quantum dots are replaced by inorganic ligands, especially phosphate ($PO_4^{3-}$) based. The ligand exchange makes the qdots dispersible in water or other polar solvents such as DSMO or formamide. We found that that with these ligands, a large drop in QE of the qdots can be prevented to a large extent. The drop in QE can be further minimised or even completely eliminated by performing the ligand exchange in water-free conditions. Hence, the following is described below:

the use of $PO_4^{3-}$ as an inorganic ligand to achieve high quantum yield in quantum dots where the original ligands are exchanged for these ligands; and performing the ligand exchange in water-free conditions to achieve quantum yields with several ligands ($PO_4^{3-}$, $S^{2-}$) to achieve quantum yields that are essentially the same of the qdot prior to ligand exchange, and increased shelf-life of the dispersion.

Example(s) 10: Phosphor Based Ligands

Example 10.1: $Na_3PO_4$ in Formamide, Water-Free

All processing and sample handling was done in a water-free glovebox environment using dried solvents and chemicals.

A stock solution of the inorganic ligand was made by dissolving 265 mg $Na_3PO_4$ (1.62 mmol) in 113 g (100 mL)

of water-free formamide (Hydranal Formamide, Fluka). After stirring for 6 hours in a glovebox the solution was filtered through a 1.2 µm syringe filter to remove any non-dissolved material. The resulting solution was 16 mM $Na_3PO_4$ in formamide.

Commercially available quantum dots from Crystalplex (CdSe/CdS/ZnS core/shell/shell) with oleate ligands (emitting at 610 nm; QE 80%) were subjected to an inorganic ligand exchange by adding 60 µL of the qdot solution (50 mg/mL in toluene) to 5 g dodecane. As polar phase 10 g of the 16 mM $Na_3PO_4$ in formamide solution was used. The mixture was stirred vigorously for 16 hours. Then the organic phase was removed and the polar phase was washed once with n-heptane. After flocculation the qdots by mixing the polar phase with 10 mL ethanol, the suspension was centrifuged to separate the solvents from the precipitate. The qdots were redispersed in 1 mL dry formamide with a small amount of $Na_3PO_4$ (to stabilise the solution), the QE of this dispersion was found to be 80-85%, which is the same as the original qdots prior to ligand exchange in an organic solvent. QE was found to drop over time, but could be maintained by having a small amount of the ligand salt ($Na_3PO_4$) in the solution.

Example 10.2: $Na_2HPO_4$ in Formamide, Waterfree

As example 10.1, now with $Na_2HPO_4$ in dry formamide solution as the polar phase. After workup the QE was found to be 79%.

Example 10.3: $Na_3PO_4$, Aqueous Processing

As example 10.1, but now in ambient conditions using water as the solvent. While the qdots transferred to the water layer, indicating a successful ligand exchange, the use of water lead to swift and extensive flocculation of the ligand exchanged quantum dots, with precluded further study.

Example(s) 11: Effect of Water

Example 11.1: $Na_2S.9H_2O$ in Formamide, Ambient

This experiment was performed in ambient conditions with solvents that were not specifically dried. No special precautions to exclude water were taken.

A stock solution was made by solving 348.2 mg $Na_2S.9H_2O$ (1.45 mmol) in 14.5 mL (16.4 g) formamide (0.1 mmol/mL; 24.01 mg/mL).

Commercially available quantum dots from Crystalplex (CdSe/CdS/ZnS core/shell/shell) with oleate ligands (emitting at 610 nm; QE 80%) were subjected to an inorganic ligand exchange by adding 1 mL of the qdot solution (5 mg/mL in toluene) to 7 mL n-Heptane. As polar phase 8 mL of fresh prepared $Na_2S.9H_2O$/FA stock solution was used (192 mg $Na_2S.9H_2O$). After stirring for 2 hours the QE of polar phase was measured to be 69%. After 10 days the QE dropped to 40.3%.

Example 11.2: $Na_2S.9H_2O$ in a 50/50 Mix of Water and Formamide

As example 11.1, now using a 50/50 l/l mixture of water and formamide as the solvent. Ligand exchange was successful but the resulting QE was low: 17%.

Example 11.3: $Na_2S$ $H_2O$ in Water

As example 11.1, now using pure water as the solvent. Ligand exchange failed. The qdots became brown and heavily flocculated.

Example 11.4: $Na_2S$ in Formamide, Water-Free

All processing and sample handling was done in a water-free glovebox environment using dried solvents and chemicals.

A stock solution was made by solving 90 mg $Na_2S$ (1.153 mmol) in 11 mL water-free formamide (0.105 mmol/mL).

Commercially available quantum dots from Crystalplex (CdSe/CdS/ZnS core/shell/shell) with oleate ligands (emitting at 610 nm; QE 80%) were subjected to an inorganic ligand exchange by adding 0.1 mL of the qdot solution (50 mg/mL in toluene) to 3.9 mL n-heptane. 4 mL of fresh prepared (not older than 2 h) $Na_2S$/formamide stock solution was used as polar phase (32.7 mg $Na_2S$). After 30 minutes of stirring, all of the qdots moved to the polar phase. The QE of the polar phase was found to be 79%. After one week the QE dropped slightly to 72%.

The invention claimed is:

1. A particulate luminescent material comprising quantum dots with a capping agent coordinating to the quantum dots, wherein the capping agent comprises a zincate ion ($Zn(OH)_4^{2-}$), and the particulate luminescent material comprises particles having an inorganic matrix hosting the quantum dots with inorganic capping agents.

2. The luminescent material according to claim 1, wherein when also organic capping agents are coordinating to the quantum dots, the amount of organic capping agents is less than 5 wt. % relative to the total weight of quantum dots.

3. The luminescent material according to claim 1, wherein the quantum dots have an outer layer comprising an inorganic compound, and wherein one or more of the following applies (i) the inorganic matrix and an outer layer of the quantum dots have an element in common, (ii) the capping agent and the inorganic matrix have an element in common, and (iii) an outer layer of the quantum dots and the capping agent have an element in common.

4. The luminescent material according to claim 1, wherein the quantum dots are dispersed within the particles, wherein the particles have a number averaged particle size in the range of 0.5-40 µm, and wherein the luminescent material comprises in the range of 0.01-5 wt. % quantum dots relative to the total weight of the luminescent material.

5. The luminescent material according to claim 1, obtainable by a method comprising: (i) providing luminescent quantum dots with an organic capping agent and providing in an exchange process said luminescent quantum dots with an inorganic capping agent in a first liquid, wherein the inorganic capping agent comprises $M_xO_y(OH)_z^n$, wherein M is selected from the group consisting of B, Al, P, S, V, Zn, Ga, Ge, As, Se, Nb, Mo, Cd, In, Sn, Sb, Te, Ta and W, wherein $x \geq 1$, $y+z \geq 1$, and wherein n indicates a positive or negative charge of the capping agent.

6. A wavelength converter element comprising a host material with a particulate luminescent material embedded therein, the particulate luminescent material comprising quantum dots with a capping agent coordinating to the quantum dots, the capping agent comprising a zincate ion ($Zn(OH)_4^{2-}$), wherein the particulate luminescent material comprises particles having an inorganic matrix hosting the quantum dots with inorganic capping agents.

7. A lighting device comprising a light source and a particulate luminescent material, wherein
the light source is configured to illuminate the particulate luminescent material, and wherein
the particulate luminescent material comprises quantum dots with a capping agent coordinating to the quantum dots, the capping agent comprising a zincate ion ($Zn(OH)_4^{2-}$), wherein the particulate luminescent material comprises particles having an inorganic matrix hosting the quantum dots with inorganic capping agents.

8. A method for the production of a luminescent material based on quantum dots, the method comprising:
(i) providing luminescent quantum dots with an organic capping agent and providing in an exchange process said luminescent quantum dots with the inorganic capping agent in a first liquid, wherein the capping agent comprises $M_xO_y(OH)_z^n$, wherein M is selected from the group consisting of B, Al, P, S, V, Zn, Ga, Ge, As, Se, Nb, Mo, Cd, In, Sn, Sb, Te, Ta and W, wherein $x \geq 1$, $y+z \geq 1$, and wherein n indicates a positive or negative charge of the capping agent, wherein the exchange process comprises a phase transfer process;
(ii) precipitating in a co-precipitation process an inorganic salt comprising precipitated material from the first liquid, the precipitated material comprising said quantum dots hosted by the co-precipitated inorganic salt; and
(iii) separating in a separation process the precipitated material from the first liquid.

9. The method according to claim 8, wherein the luminescent quantum dots have an outer layer, wherein in the co-precipitation process two or more salts ($M_1$-$A_1$; $M_2$-$A_2$) are applied, wherein at least one of the salts and the outer layer have an element in common, and wherein the inorganic capping agent and one or more of the salts have an element in common.

10. The method according to claim 8, wherein the inorganic capping agents comprise one or more of an aluminate ion ($Al(OH)_4^-$), a stannate ion ($SnO_3^-$, $SnO_3^{2-}$, and $SnO_4^{4-}$), a vanadate ion ($VO_3^-$, $VO_4^{3-}$), a molybdate ion ($MoO_4^{2-}$), a tungstate ion ($WO_4^2$), a phosphate ion ($PO_4^{3-}$), and a zincate ion ($Zn(OH)_4^{2-}$).

* * * * *